(12) United States Patent
Sung

(10) Patent No.: US 6,969,313 B2
(45) Date of Patent: Nov. 29, 2005

(54) CAST DIAMOND TOOLS AND FORMATION THEREOF BY CHEMICAL VAPOR DEPOSITION

(76) Inventor: Chien-Min Sung, No. 4 Lane 32, Chung-Cheng Rd., Tansui, Taipei County (TW) 23911

( * ) Notice: Subject to any disclaimer, the term of this patent is extended or adjusted under 35 U.S.C. 154(b) by 24 days.

(21) Appl. No.: 10/666,701

(22) Filed: Sep. 19, 2003

(65) Prior Publication Data

US 2004/0235405 A1 Nov. 25, 2004

Related U.S. Application Data

(62) Division of application No. 09/687,444, filed on Oct. 13, 2000, now Pat. No. 6,659,161.

(51) Int. Cl.[7] .............................. B24B 5/00
(52) U.S. Cl. ........................ 451/540; 51/367
(58) Field of Search ............................ 451/540, 543, 451/552; 125/36, 39; 51/307

(56) References Cited

U.S. PATENT DOCUMENTS

| 5,130,111 A | 7/1992 | Pryor |
| 5,173,089 A | 12/1992 | Tanabe et al. |
| 5,366,579 A | 11/1994 | Yamazaki et al. |
| 5,374,293 A | 12/1994 | Takashita et al. |
| 5,380,349 A | 1/1995 | Taniguchi et al. |
| 5,633,088 A | 5/1997 | Pinneo |
| 5,643,641 A * | 7/1997 | Turchan et al. ............. 427/595 |
| 5,660,881 A * | 8/1997 | Okamura ................ 427/249.13 |
| 5,776,355 A * | 7/1998 | Martin ........................ 216/52 |
| 5,827,613 A | 10/1998 | Nakayama et al. |
| 5,925,154 A | 7/1999 | Semenov et al. |
| 6,039,641 A * | 3/2000 | Sung .......................... 451/540 |

* cited by examiner

*Primary Examiner*—Eileen P. Morgan
(74) *Attorney, Agent, or Firm*—Thorpe North & Western LLP

(57) ABSTRACT

The present invention provides diamond tools, and a method for the formation thereof, using CVD techniques. In one aspect, an ephemeral mold is provided which has a diamond interface surface configured to inversely correspond to the desired shape for the working surface of a diamond layer in a tool. After the mold is provided, various CVD techniques may be used to deposit diamond layers upon the diamond interface surface of the mold. Following diamond deposition upon the diamond interface surface, the mold may be removed by various means, such as chemical etching, etc. Thus, the working surface of the diamond receives a shape which inversely corresponds to the configuration of the mold's diamond interface surface. The diamond mass may then be incorporated into a tool, if such incorporation has not yet taken place.

19 Claims, 5 Drawing Sheets

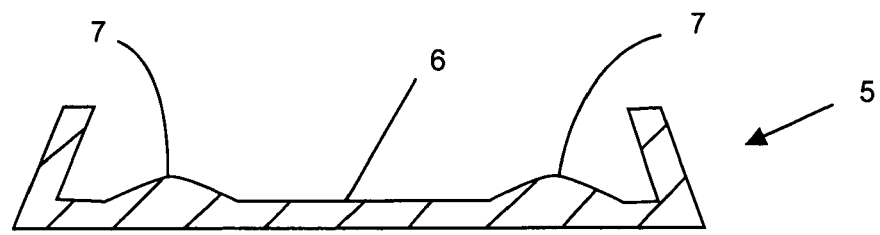
Figure 3a
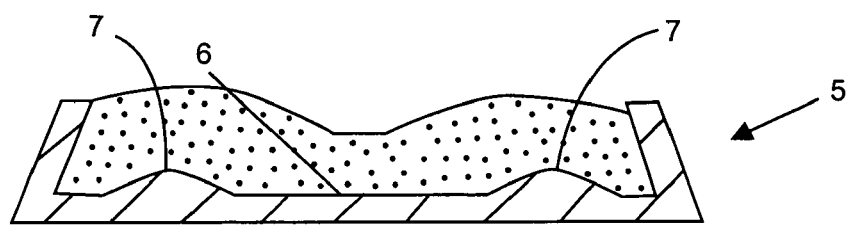
Figure 3b
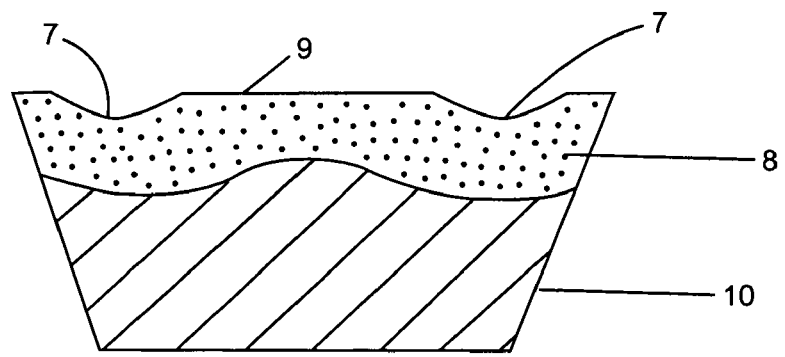
Figure 3c
Fig 3

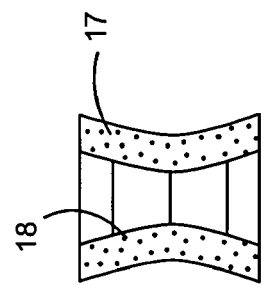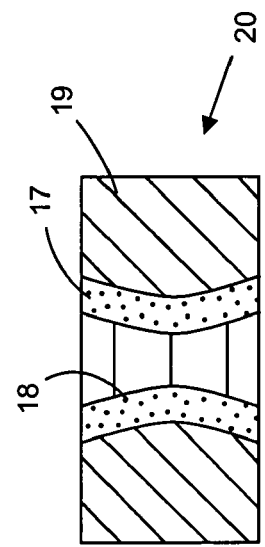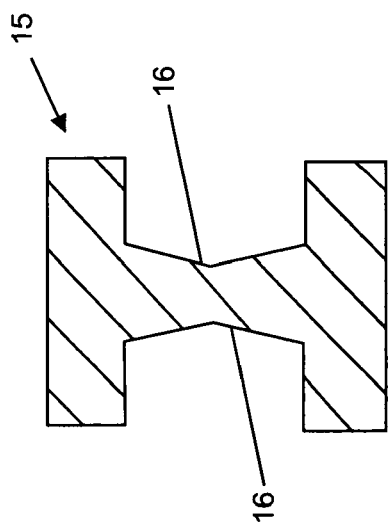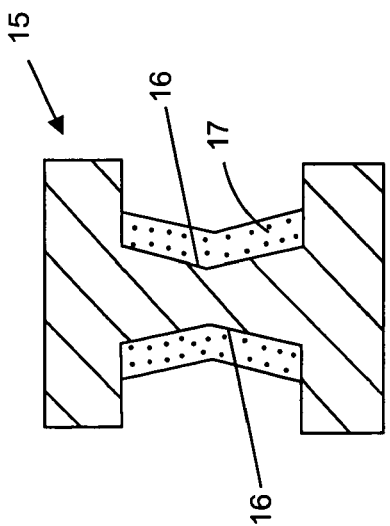
Fig 4

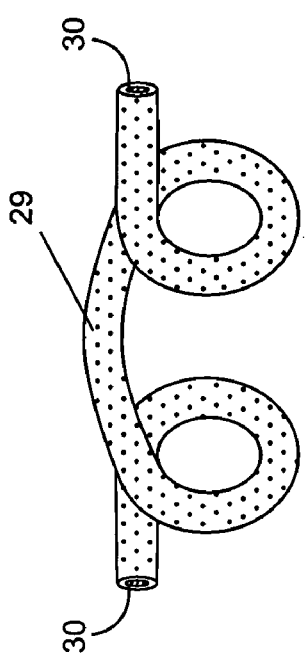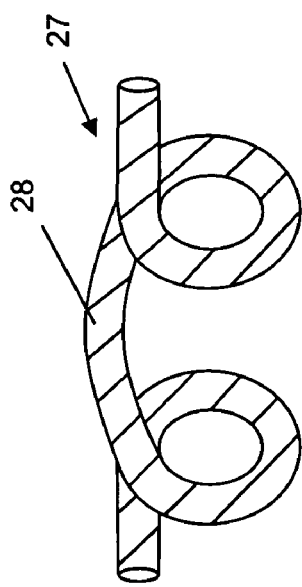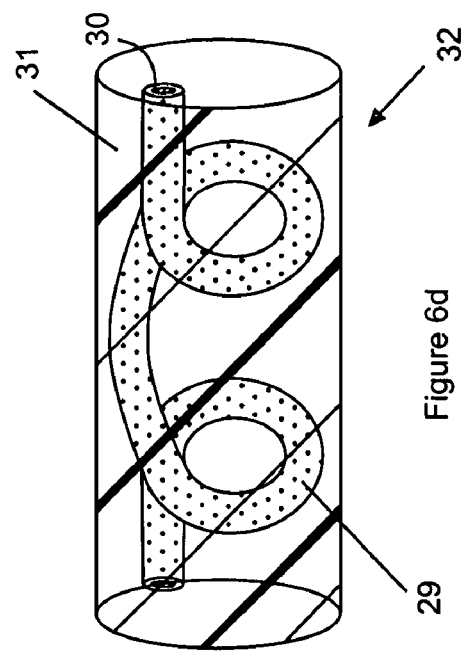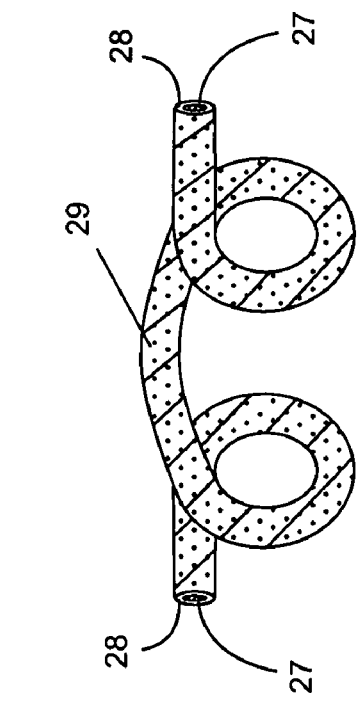
fig. 6

CAST DIAMOND TOOLS AND FORMATION THEREOF BY CHEMICAL VAPOR DEPOSITION

This application is a divisional of U.S. patent application Ser. No. 09/687,444 filed Oct. 13, 2000 now U.S. Pat. No. 6,659,161, which is incorporated herein by reference.

THE FIELD OF THE INVENTION

The present invention relates to devices incorporating super-hard materials, such as diamond or diamond-like substances, and methods for making such devices. More particularly, the present invention relates to the use of chemical vapor deposition for making devices incorporating super-hard materials.

BACKGROUND OF THE INVENTION

Diamond and diamond-like substances have many properties, such as wear resistance, thermal, conductivity, acoustic, transmission and corrosion inertness, which make them desirable for a variety of industrial applications. To this end, diamond and diamond-like substances have been incorporated into tools of various purpose such as saw blades and drill bits. One method for incorporating diamond or diamond-like materials into a tool is known as chemical vapor deposition (CVD).

Various CVD techniques have been used in connection with depositing diamond or diamond-like materials onto a substrate. Typical CVD techniques use gas reactants to deposit the diamond or diamond-like material in a layer, or film. These gases generally include a small amount (i.e. less than about 5%) of a carbonaceous material, such as methane, diluted in an amount of hydrogen.

During the CVD process, the gases are heated to a temperature sufficient to separate the carbon atoms from the carbonaceous material, to which they are bound. Normally, such a separation would cause the carbon to be deposited on the substrate as amorphous carbon or graphite. However, when free carbon atoms are surrounded by hydrogen atoms, the carbon maintains an electron configuration of diamond (i.e. $sp^3$ bonding) and deposits on the substrate as such. Further, even with the formation of non-diamond carbon on a substrate, a high hydrogen concentration readily converts the amorphous carbon or graphite back to methane. Thus, the concentration of hydrogen plays a key role in catalyzing the formation of diamond, and controlling the quality and purity thereof.

Various ways of heating the CVD gas mixture have been used, including hot filament, microwave agitation, oxyacetylene flame, and arc jet. While the temperature required for diamond deposition on a substrate is typically in the range of 800° C. to 900° C., the reaction temperature for the gases used is much higher. In fact, the higher the reaction temperature is, the more complete the decomposition of the gases into hydrogen and carbon atoms, and the faster the deposition rate of the diamond onto the substrate.

Of the above-recited heating methods, the hot filament method results in the slowest deposition rate (about 1 micron per hour), as it is only capable of reaching a temperature of about 2,200° C. in the filament. The microwave agitation method may achieve an intermediate deposition rate of about 10 microns per hour. The oxyacetylene flame method is capable of achieving a higher temperature than microwave agitation, and may yield a deposition rate of over 20 microns per hour. The arc jet method is capable of achieving the highest temperature (i.e. about 6,000° C.) and therefore yields the highest deposition rate, such as about 50 microns per hour.

It has been shown that higher deposition rates, cause the diamond or diamond-like materials to be deposited over smaller areas of substrate surface. Thus, a higher rate of deposition may be more, or less suitable, for an application depending on the size of the device and the desired characteristics of the diamond or diamond-like portions thereof.

In forming a layer of diamond, or diamond-like material on a substrate using CVD techniques, a plurality of diamond grains, or "seeds," may be first placed upon the substrate surface. The placement of such seeds may be accomplished using CVD itself. These seeds act as diamond nuclei and facilitate the growth of a diamond layer outwardly from the substrate as carbon vapor is deposited thereon. As a result, the growing side of the diamond layer becomes increasingly coarse in grain size, and must ultimately be ground and polished to a smooth finish such as by a mechanical means, in order to be suitable for many industrial applications. However, as diamond and diamond-like substances are among the hardest known materials, such mechanical grinding and polishing is difficult and tedious. Moreover, the cost of polishing often exceeds the cost for the diamond and film itself. In addition, mechanical polishing inevitably introduces microcracks on the surface. These cracks are detrimental to certain applications. For example, if the diamond film is used to propagate the surface acoustic wave (SAW) such as that for making SAW filters, surface microcracks will introduce large noise and therefore deteriorate the quality of the filtered wave.

Further, machine finishing is incapable of producing certain configurations in a diamond layer which are desirable or necessary for many industrial applications. For example, drilling a square hole through a diamond layer for creation of a wire drawing die that produces square shaped wires, is extremely difficult if not impossible.

In addition to the above-recited disadvantages, diamond or diamond-like materials which are produced by conventional CVD techniques are inefficient for making devices of certain purpose. Particularly, in many industrial applications, the surface of the diamond film requires a particular configuration in order to be of use. In such applications, the non-surface portion of the diamond or diamond-like material is unimportant to the performance of the device. However, conventional CVD techniques create the working surface by depositing thick films of diamond on the substrate and building up to the working surface to a body. Such a process wastes time and effort by slowly depositing a thick non-surface body of diamond or diamond-like materials.

In view of the foregoing, a process for making devices which incorporate a diamond or diamond-like layer that require little or no post synthesis work to achieve a finished product is desirable. Further, a process which allows the production of a device having a diamond or diamond-like material layer with an odd shape, or configuration which cannot be made by conventional techniques is highly desirable. Finally, a process for producing a diamond or diamond-like material layer which only requires a working surface thereof to be created by CVD is very desirable.

SUMMARY OF THE INVENTION

The present invention provides a diamond tool, and a method for making a diamond tool. Additionally, the present invention provides for a diamond tool made by a multi-step process that does not require surface polishing and hence will not introduce microcracks on the surface.

In one aspect, the diamond tool comprises a diamond layer having working surface with a shape which inversely corresponds to the configuration of a diamond interface surface in an ephemeral mold, upon which said diamond layer is deposited, and a non-diamond layer joined to the diamond layer. In another aspect, a method of the present invention for making a diamond tool comprises the steps of: a) providing a mold having a diamond interface surface configuration which inversely corresponds to a desired shape for a working surface of the tool; b) coating said diamond interface surface with diamond using a chemical vapor deposition (CVD) technique to form a diamond layer; and c) separating the mold from the diamond layer, such that the resultant diamond layer has a working surface which inversely corresponds to the diamond interface surface configuration of the mold.

In yet another aspect of the present invention, a diamond tool may be formed by a process comprising the steps of: a) providing a mold having a diamond interface surface configuration which inversely corresponds to a desired shape for a working surface of the tool; b) coating said diamond interface surface with diamond using a chemical vapor deposition (CVD) technique to form a diamond layer; and c) separating the mold from the diamond layer; such that the resultant diamond layer has a working surface which inversely corresponds to the diamond interface surface configuration of the mold.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 3a is cross section view of an metal mold for fabricating a diamond cutting element, or insert, in accordance with the present invention.

FIG. 3b is a cross section view of a diamond mass formed in an ephemeral mold for fabricating a diamond cutting element, or insert, in accordance with the present invention.

FIG. 3c is a cross section of a diamond cutting element, or insert formed in accordance with the present invention.

FIG. 4a is a cross section view of an metal mold for fabricating a diamond wire drawing die in accordance with the present invention.

FIG. 4b is a cross section view of a diamond mass formed on an ephemeral mold for fabricating a diamond wire drawing die in accordance with the present invention.

FIG. 4c is a cross section view of a diamond working surface for use in a wire drawing die in accordance with the present invention.

FIG. 4d is a cross section view of a diamond wire drawing die formed in accordance with the present invention.

FIG. 6a is a side view of a wire coil or pipe mold for fabricating a diamond pipe in accordance with the present invention.

FIG. 6b side view of a diamond film deposited on the outside of the wire coil mold of FIG. 6a.

FIG. 6c perspective view of the shows the diamond film of FIG. 6b after dissolving the center metal coil in accordance with the present invention.

FIG. 6d is a perspective view of the diamond pipe of FIG. 6c with the fitted inside a holder mass in accordance with the present invention.

DETAILED DESCRIPTION

Figure 1:
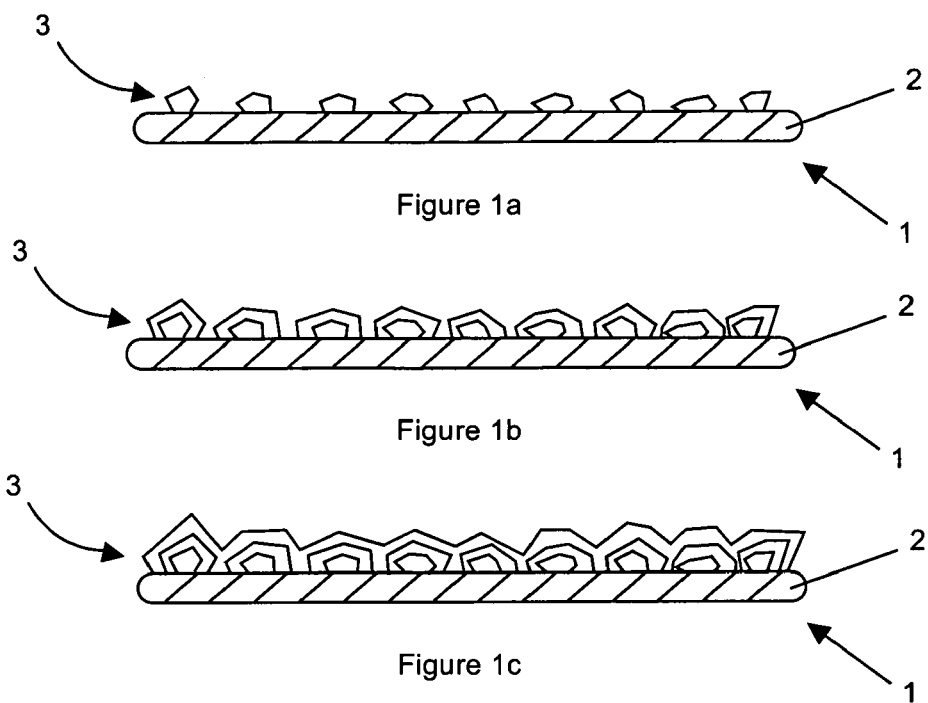
FIG. 1a is a cross section view of a diamond tool being prepared by any conventional CVD technique, having diamond nuclei deposited upon the substrate surface, as is known in the prior art.
FIG. 1b is a cross section view of a diamond tool being prepared by any conventional CVD technique, to allow the growth diamond nuclei upon the substrate surface, as is known in the prior art.
FIG. 1c is a cross section view of a diamond tool being prepared by any conventional CVD technique, to show the growing nuclei of diamond joined together on the substrate surface, to form a continuous film as is known in the prior art.

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," and, "the" include plural, referents unless the context clearly dictates otherwise. Thus, for example, reference to a diamond layer containing "a diamond particle" includes one or more of such particles, reference to "a carbon source" includes reference to one or more of such carbon sources, and reference to "a CVD technique" includes reference to one or more of such CVD techniques.

A. Definitions

In describing and claiming the present invention, the following terminology will be used in accordance with the definitions set forth below.

"Tool" refers to any object or device which may be used in creating a work product, or acting on a work piece, to accomplish a desired result. Examples of tools include, but are not limited to: saw blades, drill bits, CMP pad dressers, wire drawing dies, cutting elements or inserts, and pipes, hoses, and coils.

"Diamond," "abrasive particle," "grit," or similar terms and phrases refer to any super hard crystalline, or polycrystalline substance, or mixture of substances. Such substances include but are not limited to diamond, polycrystalline diamond (PCD), cubic boron nitride, and polycrystalline cubic boron nitride (PCBN). Further, the terms "abrasive particle," "grit," "diamond," "polycrystalline diamond (PCD)," "cubic boron nitride," and "polycrystalline cubic boron nitride, (PCBN)," may be used interchangeably.

As used herein, "substrate" means the a non-diamond surface, to on which the abrasive particles may be joined. The base portion may be any shape, thickness, or material, and includes but is not limited to metals, alloys, ceramics, and mixtures thereof. Further, the base portion may be a tool body in and of itself, or may be a material which is capable of being joined to a tool body.

"Tool body" refers to a device which makes up a substantial part of a tool, to which a diamond component may be joined, either directly, or by an intermediate material, or layer.

"Metallic" refers to any type of metal, metal alloy, or metal compound. Examples of metals include, but are not limited to: tungsten, molybdenum, tantalum, zirconium, vanadium, chromium, carbides thereof, copper, and mixtures thereof.

"Diamond interface surface" refers to any surface of a mold, or ephemeral mold, upon which diamond particles may be deposited using CVD techniques to form a diamond layer.

"Working surface" refers to the surface of a tool, which contacts a workpiece, or performs a friction-involved function during a work process. In one aspect, the working surface of a tool may be a diamond layer.

"Diamond layer" and "diamond mass" may be used interchangeably, and refer to any structure, regardless of shape, which contains diamond in any form or amount, and which can be joined to a tool. Thus, a diamond film partially or entirely covering a surface is included in these terms. Additionally, a layer of any material, such as metals, acrylics, or composites, having diamond particles disbursed therein is included in these terms.

"Non-diamond layer" and non-diamond mass" may be used interchangeably, and refers to any structure regardless of shape, which does not contain any diamond, but which can be joined to a diamond layer in order to form a diamond tool.

"Chemical vapor deposition," or "CVD" refers to any method of chemically depositing diamond particles in a vapor form upon a substrate. Various CVD techniques are well known in the art.

"Drawing channel" refers to the inner channel, or passage of a wire drawing die, through which wire is drawn.

"Inversely corresponds" refers to the inverse relationship between the conformation of a diamond layer's working surface, and the conformation of the diamond interface surface of a mold from which the working surface was made by direct contact therewith, if such surfaces are oriented in the same direction. By way of further explanation, when a diamond layer is fabricated by depositing the diamond particles of the working surface directly upon the diamond interface surface of a mold, and building the rest of the diamond thickness behind the working surface particles, the configuration imparted to the working surface would inversely correspond to that of the diamond interface surface, if the surfaces were separated and oriented in the same direction.

"Nucleation side," "nucleation surface," and similar terms may be used interchangeably, and refer to the side or surface of a diamond layer at which nucleation of diamond particles originated. Otherwise described, the nucleation surface of a diamond layer is the side or surface, which was first deposited upon the diamond interface surface of a mold.

B. Invention

Figure 2:
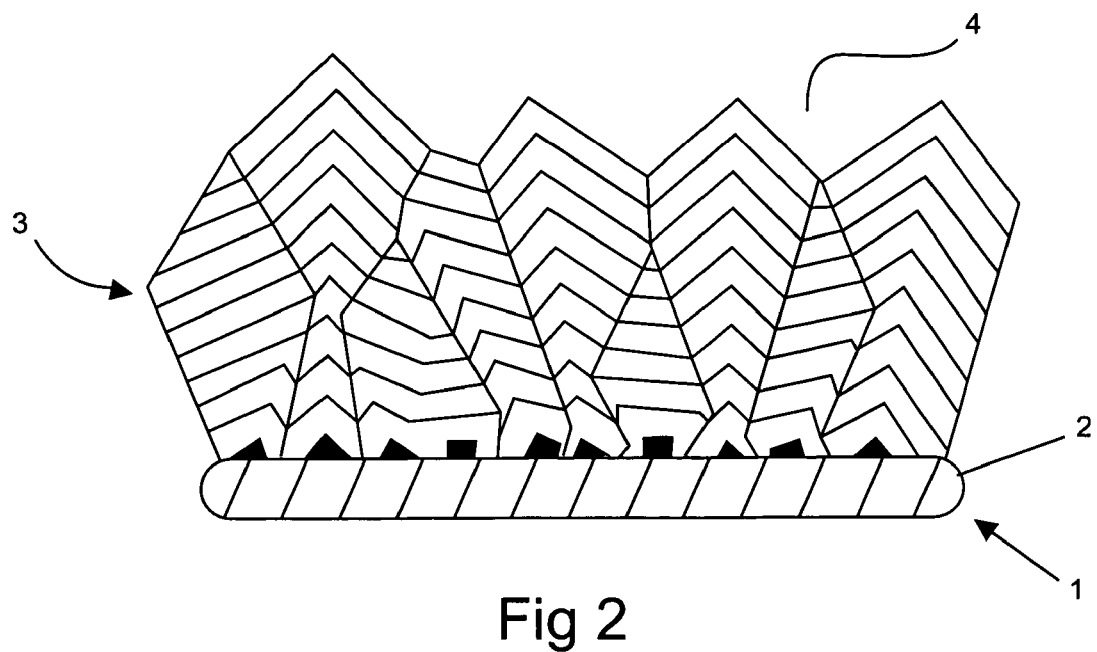
FIG. 2 is a cross section of diamond tool having a diamond film showing the diamond growth and resultant diamond surface deposited upon a substrate using any conventional CVD technique, as is known in the prior art.

It is well known in the art to make diamond tools for various applications using chemical vapor deposition (CVD) techniques. Referring to FIGS. 1a–1c, is shown generally the beginning stages of diamond growth on a tool substrate 2, to form diamond tool 1, produced by various known CVD processes. Such processes generally entail growing a diamond film 3, with increasing thickness on the outward surface of tool substrate 2. FIG. 2 shows the results of a grown diamond film deposition using CVD techniques to form a diamond layer on tool body 2. As the layer of diamond 3 continues to grow, the working surface 4 thereof becomes increasingly rough. Unfortunately a rough working surface may be unsuitable for many tool applications. Therefore, machining of the working surface 4 into a desired configuration is required.

Applicant has now discovered that diamond tools may be made by a process which removes the necessity of post formation machining or finishing, of working surface 4, and thus dispenses with the significant time and expense associated therewith. Such a process is capable of creating a tool having a diamond layer working surface that has a shape inversely corresponding to the configuration of a diamond interface surface in a mold, upon which the diamond layer is deposited. Further, a non-diamond substrate may be joined to the grown side of the diamond film to form a tool body. As such, the finished working surface is capable of receiving any configuration which may be imparted by a mold without post formation machining.

The diamond layer working surface may be formed by the deposition of diamond nuclei and subsequently joined to form a smooth interface surface using CVD. Such a tool consists of a diamond layer working surface that has a shape inversely corresponding to the configuration of a diamond interface surface in a mold upon which the diamond layer is deposited. Further, a non-diamond layer may be joined to the grown diamond surface afterward to form a tool body.

In one aspect, the process of the present invention includes providing a mold having a diamond interface surface configuration which inversely corresponds to a desired shape for a working surface of the tool, coating said diamond interface surface with diamond using a chemical vapor deposition (CVD) technique to form a diamond layer, and separating the mold from the diamond layer. In another aspect, the process of the present invention consists of providing a mold having a diamond interface surface configuration which inversely corresponds to a desired shape for a working surface of the tool, coating said diamond interface surface with diamond using a CVD technique to form a diamond layer, and separating the mold from the diamond layer.

Various CVD techniques are known in the art, and can be employed with the process of the present invention. The result of such a process is that the working surface of the diamond layer receives a configuration which inversely corresponds to the configuration of the diamond interface surface of the mold.

The mold used in the process of the present invention may be of any material sufficient to withstand the conditions of the CVD techniques, and allow the formation of a diamond film, or layer thereon. However, in one aspect, the mold may be made of a metal material. The metal material may be a member selected from the group consisting of: copper, tungsten, molybdenum, tantalum, zirconium, vanadium, and chromium. In another embodiment, the mold may be made of nonmetals, such as silicon, silicon carbide, metal carbide, graphite, boron nitride and silicon nitride.

The thickness of the diamond layer may be any thickness desired. Multiple layers of diamond may be deposited over one another using CVD techniques while in the mold, or after the initial layer has been removed from the mold to form a consolidated layer of desired thickness. In another aspect, the diamond layer may be thickened after the deposition of the initial film, using non-CVD techniques, as are known in the art of diamond fabrication and consolidation. Such thickening may take place while the initial diamond layer is still in the mold, or after it has been removed (e.g. by dissolution in acid). The diamond layer fabricated may have a thickness of from about 30 microns to about 200 microns.

Any CVD process may be used to deposit create the diamond layer for the diamond tool of the present invention. Many methods are known in the art. In one aspect of the invention, the CVD technique employed in the process of the present invention is a member selected from the group consisting of: hot filament, microwave plasma, oxyacetylene flame, and direct current arc techniques. Further, the reactant gasses used during such techniques may be any which are known in the art as useful for safely accomplishing diamond layer fabrication using a selected CVD technique. However, in one aspect, the gases used in the CVD technique are a combination of methane and hydrogen gasses.

After the diamond layer has been deposited on the diamond interface surface of the mold, the mold may be separated from the diamond using any mechanism suitable for removing the particular substance from which the mold is fabricated. In one aspect of the present invention, the mold is chemically removed from the diamond layer, such as by dissolution thereof with acid. In another aspect, the mold is physically removed from the diamond layer, for example by grit blasting or mechanical polishing. In yet another aspect, the mold is removed from the diamond layer using a heat or cold treatment, such as a furnace for melting the mold, or liquid nitrogen for freezing and crumbling the mold. In a further aspect, separation of the mold from the diamond film due to heating or cooling because of the differences in thermal expansion properties between the mold material and the diamond material.

Either before or after the mold is removed from the diamond layer, the diamond layer may be joined to a non-diamond tool body, or intermediate substrate for incorporation into a tool body. Materials for such tool bodies and substrates include any materials suitable for, or required by, a particular tool shape, use, or function. Examples without limitation include resins, metals, silicon, ceramics and composites thereof.

The types of tools which can be fabricated using the process of the present invention are any tool for which an advantage may be found for incorporating diamond therein. In many cases, the present invention enables tools to be constructed with a configuration which was difficult, if not impossible using methods known in the prior art. Examples without limitation include tools requiring a hole or channel having a non-rounded or non-circular shape such as a square shape, which cannot be fabricated using a drill bit, or other tools which require intricate working surface ornamentation such as coils in a pipe, or other delicate structures, etc. By way of specific example without limitation, coiled pipes, drawing dyes, such as wire drawing dyes, and extruding dyes may be made. Other shapes such as convex, concave, and diaphragm shapes, or configurations, as well as working surface micro-characteristics, such as rough and smooth surfaces may be easily produced using the method of the present invention. By way of example without limitation, speaker diaphragms, such as tweeter diaphragms may be produced. One significant advantage is that because little or no working surface machining is necessary after removing the mold, the number of micro cracks or fissure which are caused by such machining is substantially reduced, or eliminated. The reduced incidence of micro cracks on the diaphragm surface greatly enhances the quality of sound produced.

As the nucleation surface of the diamond layer is to be the working surface of the tool, care should be taken to ensure that this surface is of the highest quality and integrity possible. Different degrees of quality may be achieved during the CVD process, as required by the particular application of the tool being fabricated.

Various methods may be employed to increase the quality of the diamond in the nucleation surface of the diamond layer which is created by CVD techniques. For example, diamond particle quality may be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in an $sp^3$ bonding configuration, and the quality of the diamond nuclei formed is increased.

Additionally, the nucleation rate of diamond particles deposited on the diamond interface surface of the mold may be increased in order to reduce the amount of interstitial space between diamond particles. Examples of ways to increase nucleation rates include, but are not limited to: applying a negative bias in an appropriate amount, often about 100 volts, to the diamond interface surface of the mold; polishing the diamond interface surface of the mold with a fine diamond paste; and controlling the composition of the diamond interface surface. Other methods of increasing diamond nucleation will be readily apparent to those skilled in the art.

When a fine diamond paste is used to polish the diamond interface surface, many diamond particles become embedded in the diamond interface surface, and will serve as seeds for increased nucleation rates. Certain metals, such as iron, nickel, cobalt, and their alloys, are known to catalyze diamond into amorphous carbon or graphite at high temperatures (i.e. greater than 700° C.). Thus, by limiting the amount of such substance in the composition of the diamond interface surface of the mold, the amount of diamond which will be catalyzed to graphite is greatly reduced, and the overall quality of the nucleation surface is increased.

In one aspect, tungsten carbide may be used as the material for the mold, including the diamond interface surface thereof. However, by limiting the amount of cobalt binder contained therein to less than about 4% w/w, the incidence of diamond catalysis is greatly reduced. Further, it has been found that binder free tungsten carbide materials may be used to greatly reduce diamond catalysis. Additionally, it has been found that using ultra fine, or submicron tungsten carbide grains creates a very smooth diamond interface surface which increases diamond nucleation. Additionally, the smooth micro-configuration of the diamond interface surface is imparted to the working surface of the diamond layer.

Thus a diamond tool of the present invention may comprise a diamond layer having a working surface which is the nucleation surface of the diamond layer, and a non-diamond layer joined to the grown side of the diamond layer. Further, the process of making a diamond tool in accordance with the present invention may include the steps of: a) molding the working surface of a diamond layer for a tool into a desired configuration using a suitable mold, b) separating the mold from the diamond layer, and c) joining the diamond layer to a non-diamond substrate, such that the nucleation surface of the diamond layer becomes the working surface of the tool.

C. Examples

Referring now to FIGS. 3a–3c, is shown an example of various points in the process of making a diamond cutting element, or insert in accordance with the present invention. FIG. 3a shows metal mold 5, having a diamond interface surface 6, in the inverse shape of a diamond cutting insert, including chip breakers 7, for cutting ductile materials. FIG. 3b shows a diamond layer or mass 8, which has been deposited within mold 5, upon diamond interface surface 6, using a CVD process, thus receiving the inverse configuration thereof.

After the diamond layer 8 is deposited upon diamond interface surface 6, it may be thickened to any thickness desired. Such thickening may be accomplished by continuous deposition of diamond by the CVD process, or by using other methods of consolidating and making diamond masses as are known in the art.

As shown in FIG. 3c, following completion of diamond layer 8, mold 5 is removed, for example by chemical etching, and diamond layer 8 is joined with non-diamond substrate 10 to form cutting element. The attachment of diamond layer 8 to non-diamond material 10 may be accomplished by any method known to those skilled in the art, such as gluing, brazing, infiltration, etc.

Of particular note is that working surface 9 is the nucleation surface of diamond layer 8, which was in direct contact with diamond interface surface 6 of mold 5. As such, the inverse configuration of diamond interface surface 6, has been imparted to working surface 9.

Referring now to FIGS. 4a–4d, there is shown an example of various points in the process for making a wire drawing die in accordance with the present invention. FIG. 4a show a mold 15 having diamond interface surface 16 inversely configured to impart a desired shape to a wire drawing die. FIG. 4b shows diamond layer 17 deposited upon diamond interface surface 16 of mold 15. Mold 15 is removed, for example by dissolving it with chemicals, and FIG. 4c shows resultant diamond layer 17, having newly exposed working surface 18, which was the nucleation surface of diamond layer 17, during its formation.

Following the removal of mold 15, non-diamond mass 19 is joined to diamond layer 17, using any method known in the art, such as brazing or infiltration, for joining diamond with a non-diamond substance, to form wire drawing die 20. Additionally, an outer ring of stainless steel, copper, or the like, (not shown) may be placed on the perimeter of non-diamond mass 19, prior to its attachment to diamond layer 17. The space created between diamond layer 17, and the outer ring is filled with non-diamond material 19 (e.g. WC grain), and infiltrated (e.g. by a copper alloy) to create a composite tool.

Figure 5:
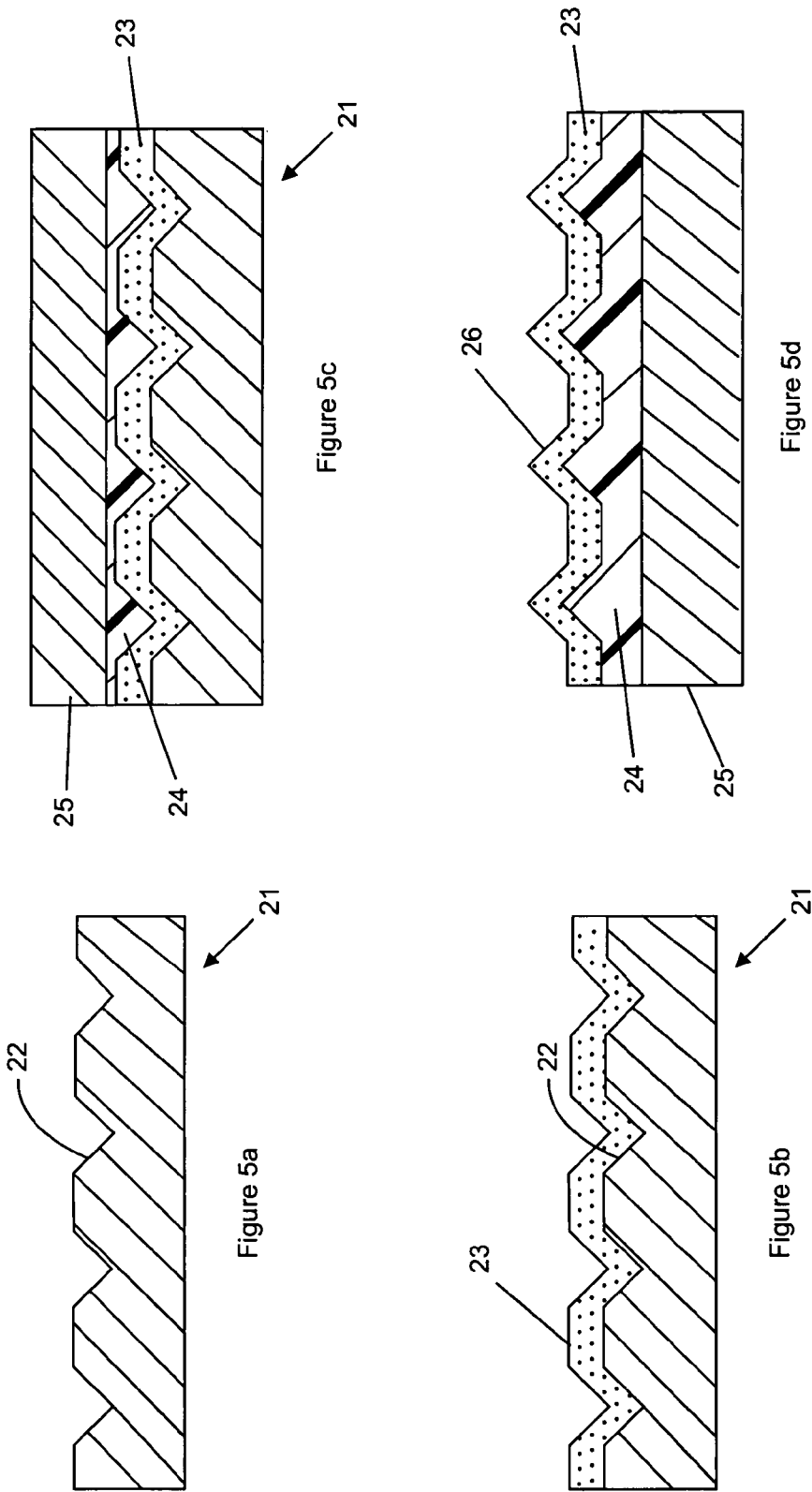
FIG. 5a is a cross section view of a mold for fabricating a diamond CMP pad dresser in accordance with the present invention.
FIG. 5b is a cross section view of a diamond mass formed on a mold for fabricating a diamond CMP pad dresser in accordance with the present invention.
FIG. 5c is a cross section view of a diamond mass formed on an ephemeral mold having a resin layer joined, to a hard substrate for fabricating a diamond CMP pad dresser in accordance with the present invention.
FIG. 5d is a cross section view of a diamond CMP pad dresser with the mold removed, in accordance with the present invention.

Referring now to FIGS. 5a–5d there is shown an example of various points in the process for making a Chemical mechanical polishing (CMP) pad dresser in accordance with the present invention. FIG. 5a shows mold 21 (e.g. silicon), having diamond interface surface 22, configured to impart a desired shape to the CMP pad dresser. FIG. 5b shows diamond layer 23 deposited upon diamond interface surface 22 of mold 21, using a CVD technique. Diamond layer 23 may be thickened to any desired thickness, using any of the methods known in the art as mentioned above.

FIG. 5c shows a hard substrate layer 25, which has been joined to diamond layer 23 by an epoxy layer 24. Attachment of hard substrate layer 25 to diamond layer 23 may otherwise be accomplished by any method known to those skilled in the art. Subsequent to the attachment of the substrate 25 by the epoxy resin layer 24 to diamond layer 23, mold 21 is removed by a process, such as chemical dissolution with a strong acid, thus exposing working surface 26 of diamond layer 23, as shown in FIG. 5d. Working surface 26 was the nucleation surface of diamond layer 23 during its fabrication, and inversely corresponds to diamond interface surface 22 of mold 21.

Referring now to FIGS. 6a–6d, there is shown an example of various points in the process for making a diamond pipe in a coiled configuration in accordance with the present invention. FIG. 6a shows mold 27 in the shape of a coiled wire or pipe, having diamond interface surface 28. Diamond is deposited upon diamond interface surface 28 using a CVD technique, and FIG. 6b shows the diamond layer 29 which is formed on diamond interface surface 28 of mold 27 as shown in FIG. 6a. Diamond layer 29 may be thickened to any desired thickness using any of the afore-mentioned methods known in the art of creating diamond masses.

Subsequent to the formation of diamond layer 29, mold 27 may be removed by a means such as chemical etching or dissolution. The removal of mold 27 exposes the nucleation surface of diamond layer 29, which becomes working surface 30. Working surface 30 inversely corresponds to the configuration of diamond interface layer 28.

After the removal of mold 27, diamond layer may be overlaid with a substance, such as acrylic resin 31, to facilitate handling, and complete diamond pipe 32, as shown in FIG. 6d. Such pipes are useful in the transportation of corrosive and otherwise harmful fluids and gases (e.g. hydrofluoric gas). Further, such pipes are useful for the transportation of sterilized fluid, which may otherwise be corrupted by reaction with a substance which is less inert than diamond.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A diamond tool formed by the process comprising the steps of:
   a) providing a mold having a diamond interface surface configuration which inversely corresponds to a desired shape for a working surface of the tool;
   b) coating said diamond interface surface with diamond using a chemical vapor deposition technique to form a diamond layer;
   c) separating the mold from the diamond layer such that the resultant diamond layer has a working surface which inversely corresponds to the diamond interface surface configuration of the mold and a growth surface opposite the working surface; and
   d) forming a tool body against at least a portion of the growth surface of the diamond layer.

2. The diamond tool of claim 1, wherein said mold comprises a metal material.

3. The diamond tool of claim 2, wherein said metal material is a member selected from the group consisting of tungsten, molybdenum, tantalum, zirconium, vanadium, chromium, carbides thereof, copper, and mixtures thereof.

4. The diamond tool of claim 1, wherein said diamond interface surface is smooth.

5. The diamond tool of claim 1, wherein said diamond interface surface is rough.

6. The diamond tool of claim 1, wherein said diamond interface surface has a concave configuration.

7. The diamond tool of claim 1, wherein said diamond interface surface has a convex configuration.

8. The diamond tool of claim 1, wherein said diamond interface surface configuration inversely corresponds to the shape of a drawing die.

9. The diamond tool of claim 8, wherein said drawing die has a channel with a non-spherical shape.

10. The diamond tool of claim 1, wherein said diamond interface surface configuration inversely corresponds to the shape of a chemical mechanical polishing (CMP) pad dresser.

11. The diamond tool of claim 1, wherein said diamond interface surface configuration inversely corresponds to the shape of a pipe.

12. The diamond tool of claim 1, wherein said diamond interface surface configuration inversely corresponds to the shape of a diaphragm.

13. The diamond tool of claim 1, wherein said diamond interface surface configuration inversely corresponds to the shape of a cutting element.

14. The diamond tool of claim 13, wherein said cutting element contains chip breakers.

15. The diamond tool of claim 1, wherein said diamond layer has a thickness of from about 20 microns to about 200 microns.

16. The diamond tool of claim 1, further comprising the step of increasing the thickness of said diamond layer to a desired thickness, using a non-chemical vapor deposition process.

17. The diamond tool of claim 1, wherein said CVD technique is a member selected from the group consisting of: hot filament, microwave plasma, oxyacetylene flame, and arc jet techniques.

18. The diamond tool of claim 17, wherein said CVD technique utilizes a combination of methane and hydrogen gasses.

19. The diamond tool of claim 1, wherein step c) is accomplished by chemically removing the mold from the diamond layer.

* * * * *